(12) United States Patent
Nagai et al.

(10) Patent No.: US 7,875,906 B2
(45) Date of Patent: Jan. 25, 2011

(54) PHOTODETECTOR AND PRODUCTION METHOD THEREOF

(75) Inventors: Youichi Nagai, Osaka (JP); Yasuhiro Iguchi, Osaka (JP); Kouhei Miura, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 319 days.

(21) Appl. No.: 12/163,039

(22) Filed: Jun. 27, 2008

(65) Prior Publication Data
US 2009/0001412 A1 Jan. 1, 2009

(30) Foreign Application Priority Data
Jun. 28, 2007 (JP) .............................. 2007-170349

(51) Int. Cl.
*H01L 31/107* (2006.01)
(52) U.S. Cl. .............................. 257/186; 257/E31.064
(58) Field of Classification Search .......... 257/E31.064, 257/12–22, 101–103, 183–197, 200, 201
See application file for complete search history.

(56) References Cited

U.S. PATENT DOCUMENTS

| | | | | |
|---|---|---|---|---|
| 5,144,381 A | * | 9/1992 | Furuyama et al. | ........... 257/186 |
| 5,656,831 A | * | 8/1997 | Kusakabe | .................... 257/186 |
| 2002/0146053 A1 | * | 10/2002 | Iwai | .............................. 372/75 |
| 2007/0029542 A1 | * | 2/2007 | Yamada | ........................ 257/14 |
| 2007/0267653 A1 | * | 11/2007 | Yoneda et al. | ............... 257/186 |

FOREIGN PATENT DOCUMENTS

| | | |
|---|---|---|
| JP | 9-219563 A | 8/1997 |
| JP | 2001-24282 A | 1/2001 |
| JP | 2004-165349 A | 6/2004 |

OTHER PUBLICATIONS

Wei et al., "Gas Source Molecular Beam Epitaxy Grown InGaAs(P)N-InP Long-Wavelength ($\lambda < 1.65\mu m$) Photodetectors Using a Solid Arsenic Source"IEEE Photonics Technology Letters, vol. 13, No. 4, pp. 352-354 (2001).

* cited by examiner

*Primary Examiner*—Chandra Chaudhari
(74) *Attorney, Agent, or Firm*—Venable LLP; Michael A. Sartori; Justine A. Gozzi

(57) ABSTRACT

The invention offers a photodetector that has an N-containing InGaAs-based absorption layer having a sensitivity in the near-infrared region and that suppresses the dark current and a production method thereof. The photodetector is provided with an InP substrate 1, an N-containing InGaAs-based absorption layer 3 positioned above the InP substrate 1, a window layer 5 positioned above the N-containing InGaAs-based absorption layer 3, and an InGaAs buffer layer 4 positioned between the N-containing InGaAs-based absorption layer 3 and the window layer 5.

8 Claims, 10 Drawing Sheets

PHOTODETECTOR AND PRODUCTION METHOD THEREOF

BACKGROUND OF THE INVENTION

1. Field of the Invention

The present invention relates to a photodetector and a production method thereof more specifically a photodetector having a sensitivity in the near-infrared region and a production method thereof.

2. Description of the Background Art

GaInNAs produced by adding nitrogen (N) to InGaAs has a band gap corresponding to the near-infrared region. Consequently, researchers and engineers have been studying to develop optical devices incorporating GaInNAs. For example, Patent literature 1 has proposed an episide-down-mounting-type photodiode that uses GaInNAs for its absorption layer and that has a laminated structure composed of an InP substrate, InP layer, GaInNAs absorption layer, InP layer, and GaInAs cap layer in this order. Nonpatent literature 1 has reported an example of a prototype production of a photodiode that uses GaInNAs(P) for its absorption layer and that has a long-wavelength-side limitation at a wavelength of 1.81 μm. The above-described prototype photodiode has a laminated structure composed of an InP substrate, buffer layer, GaInNAs(P) absorption layer, and InP cap layer in this order.

On the other hand, Patent literature 2 has disclosed the advantage of forming a GaInNAs layer through a molecular beam epitaxy (MBE) method in order to prevent the intrusion of hydrogen not only for a photodetector but also for a semiconductor laser. According to Patent literature 2, a GaInNAs layer is grown through the MBE method using a material containing no hydrogen. Then, the crystal quality is evaluated using the full width at half maximum of the intensity of photoluminescence. The evaluation confirms the improvement in the crystal quality through the use of the MBE method that uses a material containing no hydrogen. Patent literature 3 has disclosed a method to obtain a light-emitting device for emitting light in the near-infrared region. In this method, first, a GaInNAs layer is formed using a material gas containing hydrogen in a hydrogen atmosphere through an organometallic vapor phase epitaxy (OMVPE) method. Then, the layer is annealed in a nitrogen atmosphere at a temperature higher than the crystal-growing temperature. Patent literature 3 has stated that the above-described method can produce a surface-emitting laser that emits light in the near-infrared region and that has excellent crystal quality.

Patent literature 1: the published Japanese patent application Tokukaihei 9-219563

Patent literature 2: the published Japanese patent application Tokukai 2001-24282

Patent literature 3: the published Japanese patent application Tokukai 2004-165349

Nonpatent literature 1: Jian Wei et al., "Gas Source Molecular Beam Epitaxy Grown InGaAs(P)N—InP Long-Wavelength (λ>1.65 μm) Photodetectors Using a Solid Arsenic Source," IEEE PHOTONICS TECHNOLOGY LETTERS, Vol. 13, No. 4, April 2001.

The photodetectors having the above-described laminated structures, however, all have high dark current, thereby creating a major stumbling block for practical use. For example, according to Nonpatent literature 1, when the photodiode has an area of $6.5 \times 10^{-5}$ cm$^2$, a dark current of $1.2 \times 10^{-8}$ A is produced when a voltage of −1 V is applied. It has been confirmed in Nonpatent literature 1 that the dark current cannot be suppressed even when the level of the hydrogen concentration of the GaInNAsP layer is reduced through the MBE method using a material containing no hydrogen. Accordingly, it has been presumed in the literature that the high dark current is produced not only by the formation of N—H bonding but also by another cause.

SUMMARY OF THE INVENTION

A photodetector that has a GaInNAs-based absorption layer and that has low dark current has a potential for a wide range of applications. An object of the present invention is to offer a photodetector that has an N-containing InGaAs-based absorption layer having a sensitivity in the near-infrared region and that suppresses the dark current and a production method thereof.

The present invention offers a photodetector that has:

(a) an InP substrate, (b) an absorption layer that is positioned above the InP substrate and that is one absorption layer selected from the group consisting of:

(b1) a $Ga_{1-x}In_xN_yAs_{1-y-z}Sb_z$ absorption layer, where $0.4 \leq x \leq 0.8$, $0.0001 \leq y \leq 0.12$, and $0 < z \leq 0.1$, (b2) a $Ga_{1-x}In_xN_yAs_{1-y-z}P_z$ absorption layer, where $0.4 \leq x \leq 0.8$, $0.0001 \leq y \leq 0.12$, and $0.0001 \leq z \leq 0.01$, and (b3) a $Ga_{1-x}In_xN_yAs_{1-y}$ absorption layer, where $0.4 \leq x \leq 0.8$ and $0.0001 \leq y \leq 0.12$, (c) a window layer positioned above the absorption layer, and (d) an InGaAs buffer layer positioned between the absorption layer and the window layer.

The absorption layers described in (b1) to (b3) above are collectively referred to as "an N-containing InGaAs-based absorption layer."

In contrast to the structure in which the window layer is grown directly on the absorption layer, the above structure can prevent the deterioration of the crystal quality (such as the generation of imperfections) of the absorption layer, thereby preventing the accompanying increase in the dark current. More specifically, in the case where the crystals constituting the window layer contain P or Al, when the window layer is brought into direct contact with the N-containing InGaAs-based absorption layer, an intermediate product containing AlN or P is produced at the interface between the N-containing InGaAs-based absorption layer and the window layer. The intermediate product impairs the crystal quality of the N-containing InGaAs-based absorption layer and the window layer, increasing the dark current. When the InGaAs buffer layer is placed between the foregoing window layer containing P or Al and the N-containing InGaAs-based absorption layer, problems such as the above-described production of the intermediate product can be prevented.

The above-described InP substrate, absorption layer, InGaAs buffer layer, and window layer each may have a lattice constant that differs from the lattice constant of any of the other members described above by at most 0.2% of the lattice constant of each of the members being compared. When this condition is realized, strain is not generated significantly between the grown layers. Consequently, the dark current is suppressed.

The above-described window layer may be composed of InP or InAlAs. InP and InAlAs each have high transmittance for near-infrared light and can be lattice-matched with the absorption layer and the like. Furthermore, because the InGaAs buffer layer is provided between the window layer and the absorption layer as described above, deterioration of the crystal quality of the absorption layer caused by the P or Al is not created. As a result, the dark current can be reliably decreased.

When the above-described absorption layer is a $Ga_{1-x}In_x$-$N_yAs_{1-y-z}P_z$ absorption layer, the P content "z" falls into the range of 0.0001 to 0.01 according to the foregoing predetermined range. The amount of P in this range is minute. Consequently, the GaInNAs absorption layer secures good crystal quality. In addition, the band gap is not increased notably, so that the absorption limit is not significantly shifted to the shorter-wavelength side.

As for the N in the foregoing N-containing InGaAs-based absorption layer, the N content "y" falls into the range of 0.0001 to 0.12 as described above. In response to the above-described range, the increasing of the In content "x" enables the realization of a photodetector having an absorption layer that lattice-matches with the InP substrate and that has a band-gap wavelength (longest detectable wavelength) of 1.65 to 3.0 μm.

The above-described absorption layer may have a hydrogen concentration of at most $2\times10^{18}/cm^3$. The achieving of this condition can prevent the deterioration of the crystal quality of the absorption layer caused by the intrusion of hydrogen, thereby enabling the prevention of the accompanying increase in the dark current. In order to achieve the foregoing hydrogen concentration, any film-forming method may be employed. For example, when the MBE method is used, the concentration can be easily attained by the use of a material containing no hydrogen in its chemical composition formula.

The above-described absorption layer may have a thickness of more than 1 μm and at the same time the above-described window layer may have a thickness of more than 0.2 μm. When those conditions are fulfilled, a photodetector having a practically sufficient sensitivity can be obtained. In addition, it is recommended that the absorption layer have a thickness of at most 6 μm and the window layer have a thickness of at most 2 μm.

The present invention offers a method of producing a photodetector. The method has the following steps:
(a) a step of preparing an InP substrate,
(b) a step of epitaxially growing, on the InP substrate, an underlying buffer layer and an N-containing InGaAs-based absorption layer successively through the MBE method,
(c) a step of epitaxially growing, on the absorption layer, an InGaAs buffer layer, and
(d) a step of epitaxially growing, on the InGaAs buffer layer, a window layer through the OMVPE method to finally form a laminated body.

The above-described structure can decrease the hydrogen concentration of the absorption layer, which is an important portion and which is affected greatly by hydrogen, without increasing the maintenance cost of the film-forming apparatus and without decreasing the film-forming efficiency. The InGaAs buffer layer may be formed through either the MBE method or the OMVPE method. Even another method may be used to form the layer.

After the growth of the above-described window layer, the laminated body including the InP substrate may be annealed at a temperature higher than that for growing the absorption layer and less than 800° C. in a phosphorus-containing atmosphere or in a phosphorus-and-arsenic-containing atmosphere. The annealing can further decrease the hydrogen concentration while preventing phosphorus, arsenic, or both from leaving from the photodetector.

The present invention can offer a photodetector that has an N-containing InGaAs-based absorption layer having a sensitivity in the near-infrared region and that suppresses the dark current.

DETAILED DESCRIPTION OF THE INVENTION

Figure 1:
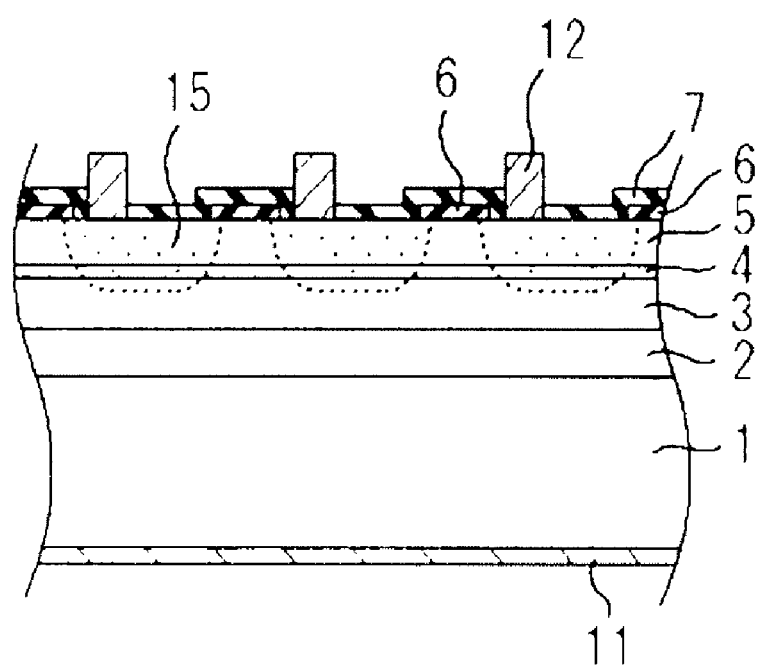
FIG. 1 is a cross-sectional view showing a photodetector in an embodiment of the present invention.

FIG. 1 is a cross-sectional view showing a photodetector 10 in an embodiment of the present invention. The photodetector 10 has an array with a plurality of light-receiving portions. Of course, the photodetector may be composed of a single light-receiving portion. The photodetector 10 shown in FIG. 1 has a laminated structure composed of an n-type InP substrate 1, an n-type buffer layer 2, an N-containing InGaAs-based absorption layer 3, an InGaAs buffer layer 4, a window layer 5, a Zn-diffusion-introducing mask pattern 6, and an antireflection (AR) film 7 in this order. In this case, the n-type buffer layer 2 may be formed by using InGaAs or the like and the window layer 5 may be formed by using InP or InAlAs. Zn is diffused through the Zn-diffusion-introducing mask pattern 6 to reach the N-containing InGaAs-based absorption layer 3, so that p-type regions 15 are formed. An n-electrode 11 is formed at the back face of the n-type InP substrate 1 of the laminated structure so as to achieve an ohmic contact. P-electrodes 12 are formed on the p-type regions 15 so as to achieve an ohmic contact. The structure shown in FIG. 1 has a feature in that the InGaAs buffer layer 4 is provided between the N-containing InGaAs-based absorption layer 3 and the window layer 5.

Figure 5:
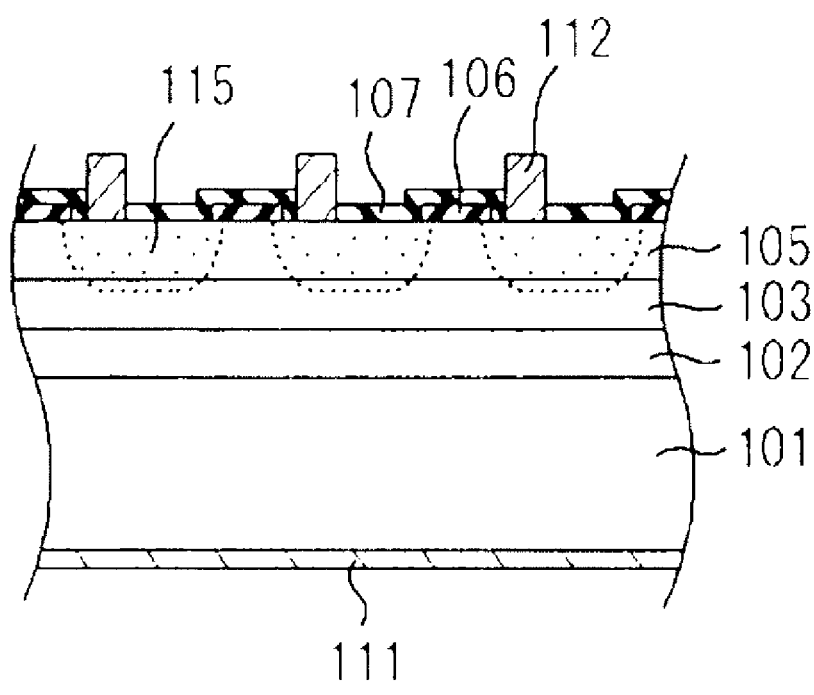
FIG. 5 is a cross-sectional view showing the structure of the photodetector of Comparative example.

As shown in FIG. 5, in the structure of a conventional photodetector 110, a window layer 105 is brought into direct contact with an N-containing InGaAs-based absorption layer 103. In this case, the below-described problems are caused.

(a) When the Window Layer is Formed of InP:

During an early stage of the growth of the InP window layer 105, P is excessively introduced into the upper face portion of the N-containing InGaAs-based absorption layer 103. Consequently, an intermediate product is produced at the interface between the N-containing InGaAs-based absorption layer 103 and the InP window layer 105. The intermediate product becomes a cause of impairing the property and condition of the interface and the crystal quality of the window layer. In addition, the composition of the upper face portion of the N-containing InGaAs-based absorption layer 103 differs considerably from that of the underlying inner portion, thereby causing the generation of strain. As a result, for example, when the planar PIN-type photodiode 110 is produced, the deterioration of the crystal quality (the increase in the imperfection density) at the pn junction causes an increase in the dark current.

(b) When the Window Layer is Formed of AlInAs:

In this case, Al in the window layer 105 and N in the N-containing InGaAs-based absorption layer 103 have a strong affinity with each other and therefore form AlN. Consequently, as in the case of P described above, the formed AlN impairs the crystal quality of the window layer 105 and the N-containing InGaAs-based absorption layer 103, increasing the dark current.

In both of (a) and (b) described above, the increase in the dark current is attributable to the providing of the window layer 105 directly on the N-containing InGaAs-based absorption layer 103. On the other hand, the photodetector 10 of the present invention is provided with the InGaAs buffer layer 4 between the N-containing InGaAs-based absorption layer 3 and the window layer 5. This structure can solve both problems described in (a) and (b) above, so that the dark current can be decreased. It is desirable that the above-described InGaAs buffer layer 4 have a thickness of more than 10 nm and not more than 500 nm. The reason why the thickness is to be more than 10 nm is to securely coat the N-containing InGaAs-based absorption layer 3 over the entire surface of the wafer having a diameter of 2 or 3 inches. In particular, in the case of an image pickup apparatus and a two-dimensional array sensor, because the chip area is large, the coating condition significantly affects the chip yield. On the other hand, it is necessary to have a thickness of not more than 500 nm in order to suppress the absorption of light as much as possible in the case of the episide up mounting. The InGaAs buffer layer 4 absorbs light having a wavelength shorter than that of the 1.7-μm band. Consequently, in the case of an image pickup apparatus and a sensor for light ranging from the near-infrared region to the visible-light region, if the buffer layer is excessively thick, the absorption of light exercises its undesirable effect.

As described above, the InGaAs buffer layer 4 is provided between the N-containing InGaAs-based absorption layer 3 and the window layer 5. This structure can further acquire the below-described productional advantages. In the case where the window layer is formed of InP, when the layer is formed through the MBE method, phosphorous compounds adhere to the inner wall of the MBE film-forming apparatus. The adhering compounds fall off or reevaporate at irregular intervals to intrude into the product, considerably reducing the product yield. To avoid this problem, it is necessary to remove the adhering phosphorous compounds periodically from the inner wall of the film-forming apparatus. This operation increases the cost for maintenance. On the other hand, the OMVPE method is free from this problem, so that the method enables the low-cost formation of the InP window layer. The high-concentration hydrogen in the InP window layer 5 resulting from the use of the OMVPE method can be decreased with an annealing operation.

Figure 2:
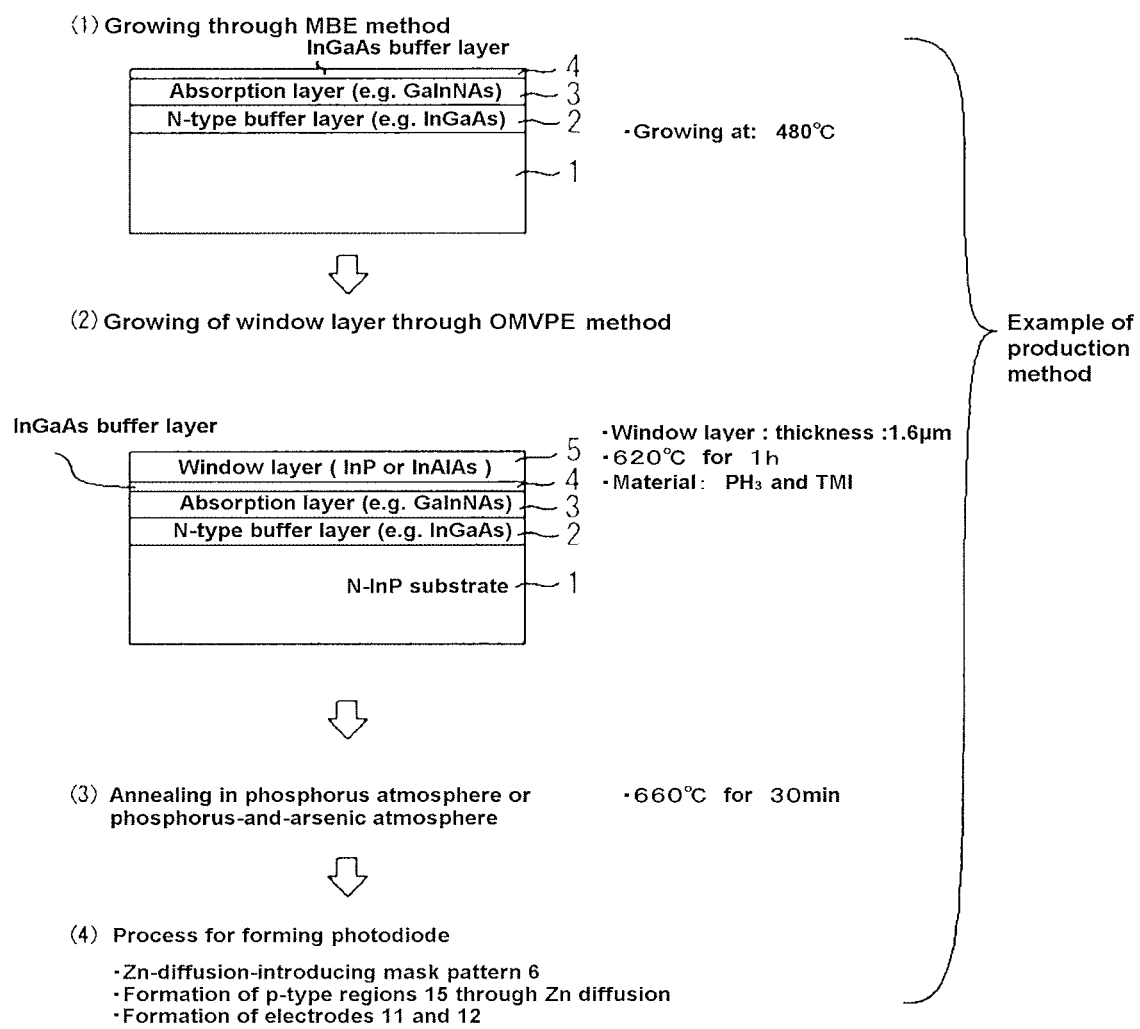
FIG. 2 is an illustration of an example of the production method of the photodetector shown in FIG. 1.

FIG. 2 is an illustration of an example of a method of producing a photodetector of the present invention. An n-type buffer layer 2 is epitaxially grown on an n-type InP substrate 1 through the MBE method. The n-type buffer layer 2 can be formed by using InGaAs, InP, or the like. When InP is grown through the MBE method, in order to prevent phosphorous compounds from adhering to the inner wall of the MBE film-forming chamber and then falling off to intrude into the product, it is necessary to remove the adhering phosphorous compounds periodically. Although an InP buffer layer can be employed, in consideration of the above-described additional operation, it is recommended that the InGaAs buffer layer 2 be employed.

Before the completion of the formation of the foregoing n-type buffer layer 2, in order to prepare the formation of the N-containing absorption layer 3, the feeding of an N-containing gas into the chamber of the MBE apparatus is started and maintained. The reason is explained below. An N plasma is used to form the N-containing InGaAs-based absorption layer 3. The formation of the N plasma requires several minutes from the time when the feeding of the N-containing gas, such as $N_2$ gas, is started. Consequently, if the formation-completed buffer layer 2 is left standing during that several minutes, the buffer layer 2 produces an uneven surface. To prevent this unevenness, it is necessary to start the feeding of $N_2$ gas while the buffer layer 2 is being formed. Then, immediately after the completion of the formation of the buffer layer 2, the N plasma is generated to promptly start the formation of the N-containing InGaAs-based absorption layer 3.

As described above, when the N-containing gas is fed into the chamber of the MBE apparatus, N intrudes into the buffer layer 2. In step with the time of the intrusion of N, an Sb molecular beam is generated at the Sb irradiation cell of the MBE apparatus to irradiate the buffer layer 2 with the Sb molecular beam. This irradiation forms at the upper-layer portion of the buffer layer 2 a partial layer containing both N and Sb. When the buffer layer 2 is formed of InGaAs, a GaInNAsSb layer is formed as the partial layer containing both N and Sb. When the buffer layer 2 is formed of InP, an InPNSb layer is formed as the partial layer containing both N and Sb. In either of these two cases, in the partial layer containing both N and Sb, the N content becomes smaller than that of the absorption layer. This result enables the easy production of the N-containing InGaAs-based absorption layer that attains the lattice matching with the InP substrate.

It is desirable that the buffer layer containing both N and Sb have a lattice constant of at least 99.9% and at most 100.1% of that of the InP substrate. To realize this condition, it is necessary to control the Sb content, which considerably affects the lattice constant, in accordance with the N content. The N content is determined by the flow rate of the N-containing gas and the crystal-growing condition, which depends on the power of the N plasma. In consideration of the N content, the Sb content is controlled so that the lattice constant can fall into the above-described range. The Sb content can be controlled by adjusting both the opening angle of the shutter of and the temperature of the Sb irradiation cell, which is the supply source of the molecular beam. In addition, the Sb content can also be controlled by performing the opening and closing of the shutter of the Sb irradiation cell at short intervals so that the ratio of the total of the opening periods to that of the closing periods can be varied.

The N-containing InGaAs-based absorption layer 3 can be formed using GaInNAs, GaInNAsSb, GaInNAsP, or GaIn- NAsSbP. In other words, the N-containing absorption layer can be a GaInNAs layer, GaInNAsSb layer, GaInNAsP layer, or GaInNAsSbP layer. The N-containing absorption layer 3 epitaxially grown on the buffer layer has a composition that is determined to be in step with the lattice constant of the InP substrate. Accordingly, the absorption layer is formed so as to have an In content higher than that of the buffer layer. As a result, the GaInNAs layer, GaInNAsSb layer, GaInNAsP layer, or GaInNAsSbP layer comes to have a narrow band gap, broadening the sensitivity to a longer-wavelength region. As described above, the combination of the buffer layer containing both N and Sb and the absorption layer 3 formed as the GaInNAs layer, GaInNAsSb layer, GaInNAsP layer, or GaInNAsSbP layer enables the production of a photodiode that has a sensitivity at a longer-wavelength region of 1.7 μm or more and that has low dark current.

Figure 3:
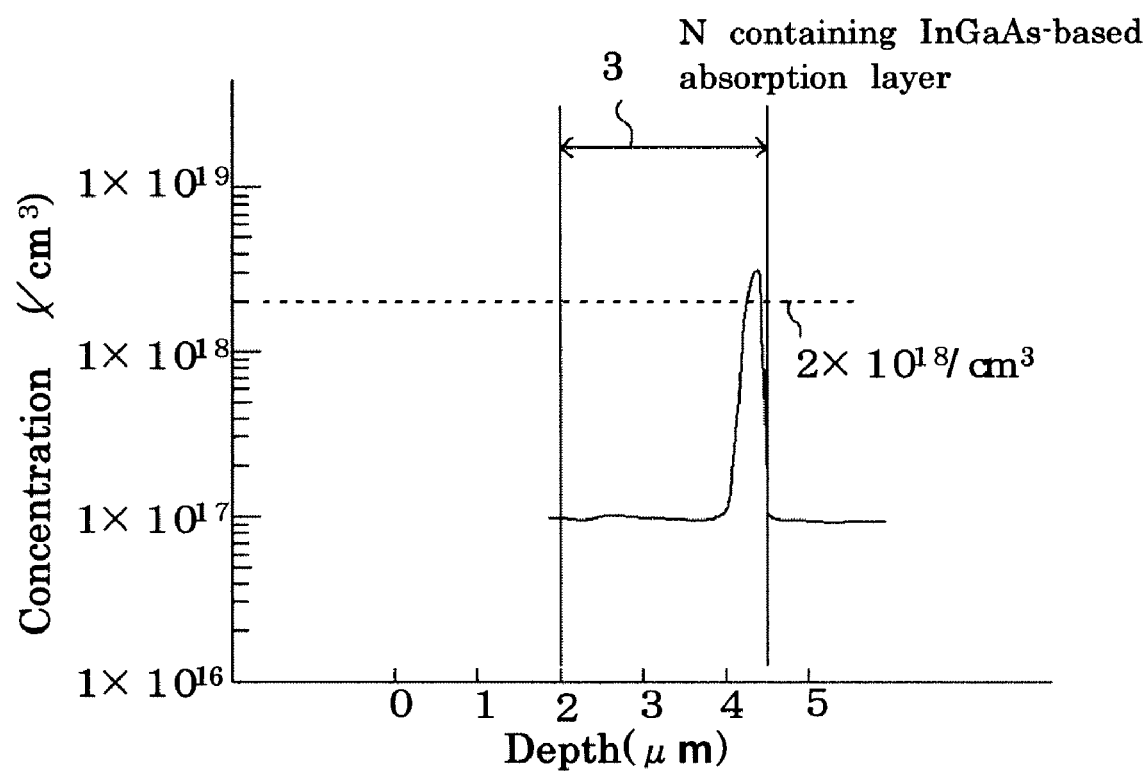
FIG. 3 is a schematic representation explaining the depth profile of the hydrogen concentration of an N-containing InGaAs-based absorption layer grown through the MBE method.
Figure 4:
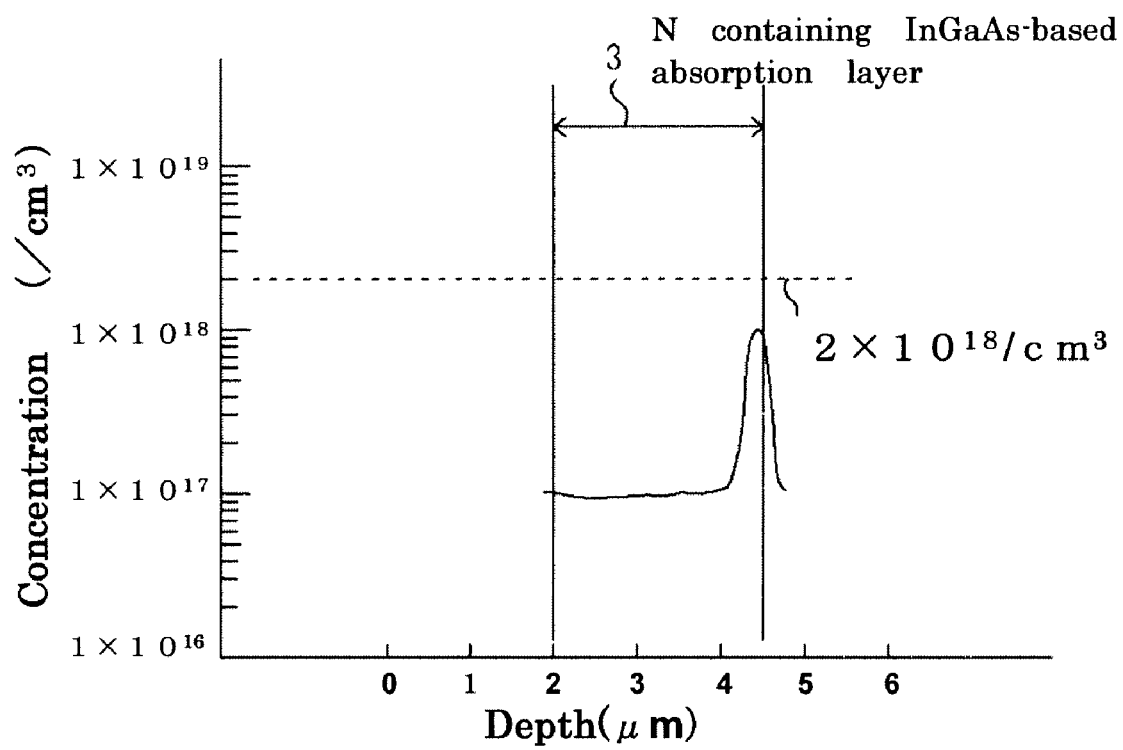
FIG. 4 is a schematic representation explaining the depth profile of the hydrogen concentration of an N-containing InGaAs-based absorption layer that is grown through the MBE method and then subjected to an annealing operation.

When grown through the MBE method without using a material containing hydrogen, the N-containing InGaAs-based absorption layer 3 has, as shown in FIG. 3, a high-hydrogen-concentration layer in a depth range as narrow as 0.5 μm or less from the bottom face. However, the layer above the foregoing layer can have a hydrogen concentration as low as $1 \times 10^{17}$ to $2 \times 10^{17}$/cm$^3$ or so. The peak concentration in the high-hydrogen-concentration layer slightly exceeds $2 \times 10^{18}$/cm$^3$. Nevertheless, as shown in FIG. 4, the peak hydrogen concentration can be decreased to less than $2 \times 10^{18}$/cm$^3$ by performing an annealing operation at 680° C. for two minutes or so. In addition, as explained below (see FIG. 7), when the absorption layer 3 is grown through the OMVPE method, the hydrogen concentration becomes high throughout the layer, taking a value close to $1 \times 10^{19}$/cm$^3$.

The InGaAs buffer layer 4 is epitaxially grown on the above-described N-containing InGaAs-based absorption layer 3. The growing temperature is about 480° C. As described above, it is recommended that the InGaAs buffer layer 4 have a thickness of more than 10 nm and not more than 500 nm. When the device is episide-down-mounted, it is not necessary to decrease the thickness of the InGaAs buffer layer 4.

Furthermore, it is recommended that in the InGaAs buffer layer 4, the InP substrate 1, the N-containing InGaAs-based absorption layer 3, and the window layer 5 epitaxially grown on the foregoing InGaAs buffer layer 4, the difference in lattice constant between individual layers be at most 0.2% of the lattice constant of each of the layers being compared so that the epitaxial growth producing a low lattice-defect density can be achieved. (In this paragraph, the substrate is treated as a layer.) The above description means that when the lattice constant of any of the above-described layers is expressed as "a" and the difference in lattice constant between that layer and any of the other layers is expressed as "Δa," the formula |Δa/a|≦0.002 is to be satisfied.

Next, the window layer 5 is epitaxially grown on the InGaAs buffer layer 4. The window layer 5 may be formed by using either InP or InAlAs. In the case of InP, for the above-described reason, it is recommended that the layer be formed through the OMVPE method, rather than the MBE method. When the InP layer is formed through the OMVPE method, it is recommendable to use both phosphine ($PH_3$) and trimethylindium (TMIn) as the material gas. The layer is grown at a temperature of about 620° C. to attain a thickness of, for example, 1.6 μm. When InAlAs is used for the window layer 5, either the OMVPE method or the MBE method may be employed to form the layer.

Subsequently, an annealing operation is performed at 660° C. for 30 minutes in an atmosphere produced by feeding a phosphorus-containing gas or a phosphorus-and-arsenic-containing gas. In the foregoing atmosphere, the reason why the phosphorus-containing gas is fed is to prevent the occurrence of dephosphorization of the InP substrate 1 or the InP window layer 5. When InAlAs is used for forming the window layer 5, a phosphorus-and-arsenic-containing gas is used to prevent dephosphorization of the InP substrate 1 and to prevent arsenic from leaving the InAlAs window layer 5. The annealing operation at 660° C. for 30 minutes decreases the hydrogen concentration of the N-containing InGaAs-based absorption layer 3. Consequently, the peak value of the hydrogen concentration in the high-hydrogen-concentration layer in the N-containing InGaAs-based absorption slayer 3 decreases from the value of $2 \times 10^{18}$/cm$^3$ to reach a value of about $1 \times 10^{18}$/cm$^3$ (see FIG. 9). As a result, the crystal quality of the N-containing InGaAs-based absorption layer 3 is improved, so that the dark current can be suppressed.

By referring to FIG. 1, the subsequent process is explained below. To form the structure of the photodiode, the Zn-diffusion-introducing mask pattern 6 is provided. By using the Zn-diffusion-introducing mask pattern 6 as a mask, Zn is introduced so that it can reach the N-containing InGaAs-based absorption layer 3. The introduction of Zn forms the p-type regions 15. Next, the p-electrodes 12 are formed on the p-type regions 15 so as to achieve an ohmic contact. The n-electrode 11 is formed at the back face of the n-type InP substrate 1 so as to achieve an ohmic contact. In the case of epside up mounting, to increase the sensitivity, the AR film 7 is formed so as to cover the mask pattern 6 and the surface of the p-type regions 15.

First Embodiment

Embodiments of the present invention described above are explained below. First embodiment explains the results of the measurement of dark current performed on Example A and Comparative example B. Specimens of the two examples each had a laminated structure formed through the MBE method without being subjected to an annealing operation for dehydrogenation. As shown in FIG. 1, Example A had a laminated structure in which the InGaAs buffer layer 4 was placed between the GaInNAs absorption layer 3 and the InP window layer 5. On the other hand, as shown in FIG. 5, the photodiode 110 of Comparative example B was formed by epitaxially growing the InP window layer 105 directly on the GaInNAs absorption layer 103. Both specimens had the same structure except for the portions described above. The GaInNAs absorption layers 3 and 103 each had an N content of 1.0 at % in the V-group atoms (in the expression $Ga_{1-x}In_xN_yAs_{1-y}$, the N content is y=0.01) and a peak wavelength of 1.8 μm in photoluminescence.

The photodiode 10 of Example A with an active diameter of 100 μm and the photodiode 110 of Comparative example B with an active diameter of 100 μm were subjected to the measurement of the dark current with the application of a voltage of −1 V. The obtained results are shown in Table I. As shown in Table I, whereas Comparative example B had a dark current of $1 \times 10^{-8}$ A, Example A had a dark current of $1 \times 10^{-9}$ A, which is smaller by an order in magnitude. This result is attributable to the following effect. The placing of the InGaAs buffer layer 4 between the GaInNAs absorption layer 3 and the InP window layer 5 prevented not only the deterioration of the property and condition of the surface due to the precipitation of GaInNAsP, the intermediate product between P and N, and so on but also the deterioration of the crystal quality resulting from the foregoing deterioration. The above-described deteriorations occur when the InP window layer 5 is grown directly on the GaInNAs absorption layer 3.

TABLE I

| | Structure | Production method | GaInNAs absorption layer | | Dark current of photodiode with −1 V being applied (active diameter: 100 μm) |
| --- | --- | --- | --- | --- | --- |
| | | | Peak wavelength in photoluminescence | N content | |
| Example A | Invented structure (see FIG. 1) | All layers were grown by MBE | 1.8 μm | 1.0% | $1 \times 10^{-9}$ A |
| Comparative example B | Conventional structure (see FIG. 5) | All layers were grown by MBE | 1.8 μm | 1.0% | $1 \times 10^{-8}$ A |

Figure 6:
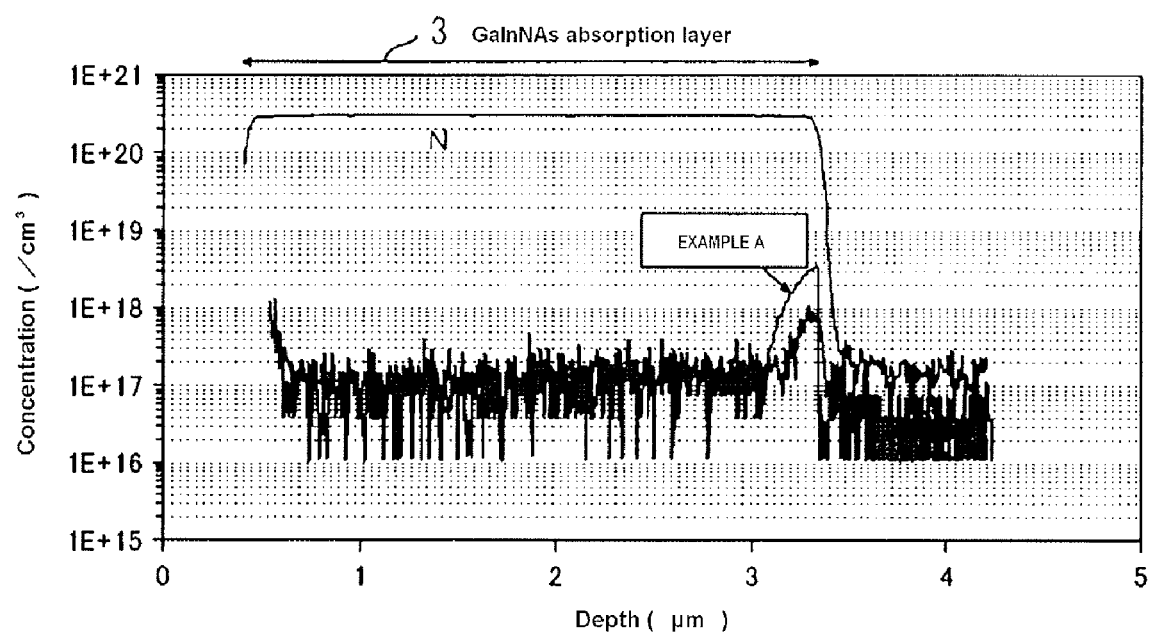
FIG. 6 is a diagram showing the distribution of hydrogen concentration (measured data) of the GaInNAs absorption layer of Example A in an embodiment.

The GaInNAs absorption layer 3 can decrease its hydrogen concentration by forming the layer through the MBE method. FIG. 6 shows a depth profile of hydrogen concentration of the GaInNAs absorption layer 3 of Example A. A high-hydrogen-concentration layer is formed locally in the vicinity of the bottom face of the GaInNAs absorption layer 3. However, the layer above the high-hydrogen-concentration layer has a hydrogen concentration of $1 \times 10^{17}/cm^3$ or so, which is a sufficiently low value to the extent of producing no problem in practical use. On the other hand, the InP window layer 5 can be formed through the OMVPE method at increased growth rate. In this case, the high-concentration hydrogen in the InP window layer 5 can be handled by performing an annealing operation at 600° C. to 800° C. or so.

Second Embodiment

Second embodiment explains the results of the measurement of dark current performed on Examples C1 to C4. Although Examples C1 to C4 each have a laminated structure according to the present invention, their production methods are different from one another as shown below.

Example C1: On the InP substrate 1, the InGaAs buffer layer 2, the GaInNAs absorption layer 3, the InGaAs buffer layer 4, and the InP window layer 5 were all grown successively through the OMVPE method. No annealing operation was performed thereafter.

Example C2: As with Example C1, a laminated structure was formed by using the OMVPE method for forming all the layers. Subsequently, an annealing operation was performed at 660° C. for 30 minutes.

Example C3: On the InP substrate 1, the InGaAs buffer layer 2, the GaInNAs absorption layer 3, the InGaAs buffer layer 4, and the InP window layer 5 were all grown successively through the MBE method. Subsequently, an annealing operation was performed at 660° C. for 30 minutes.

Example C4: On the InP substrate 1, the InGaAs buffer layer 2, the GaInNAs absorption layer 3, and the InGaAs buffer layer 4 were all grown successively through the MBE method. Then, the InP window layer 5 was grown through the OMVPE method. Subsequently, an annealing operation was performed at 660° C. for 30 minutes.

Figure 7:
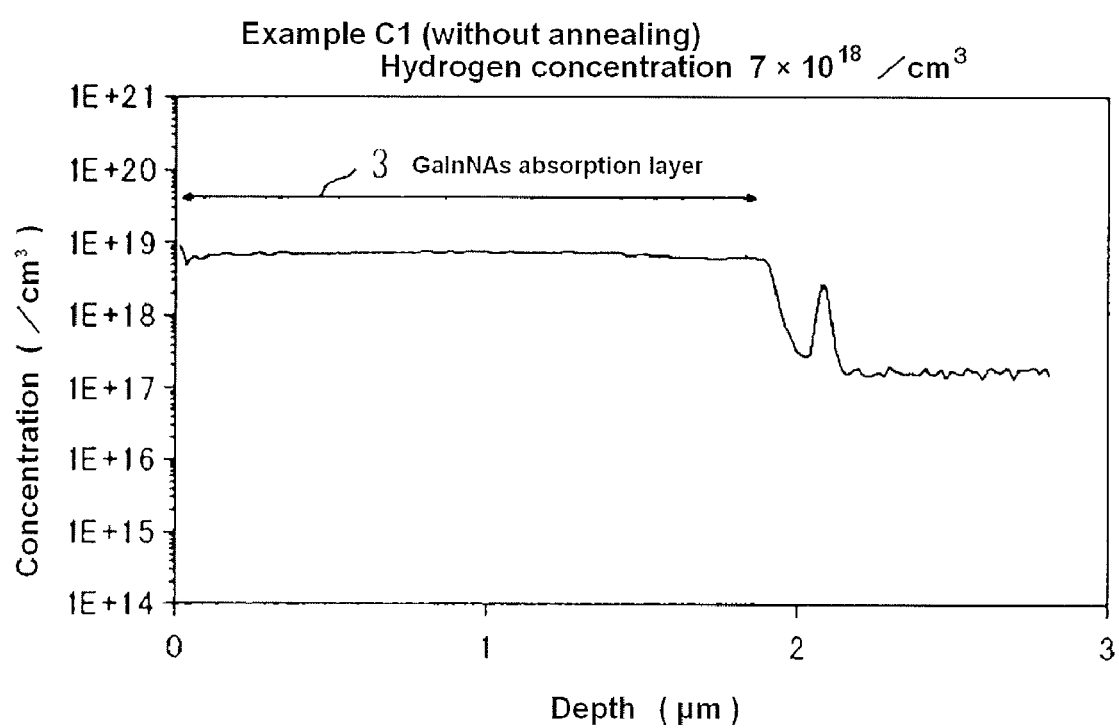
FIG. 7 is a diagram showing the distribution of hydrogen concentration (measured data) of the GaInNAs absorption layer of Example C1 (without annealing) in an embodiment.
Figure 8:
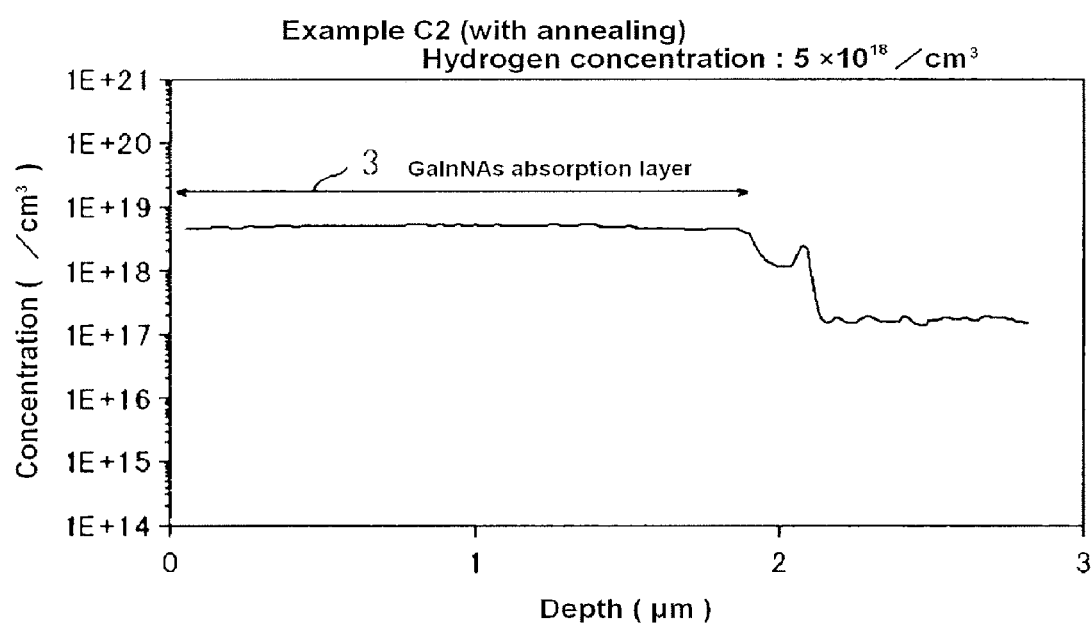
FIG. 8 is a diagram showing the distribution of hydrogen concentration (measured data) of the GaInNAs absorption layer of Example C2 (with annealing) in an embodiment.
Figure 9:
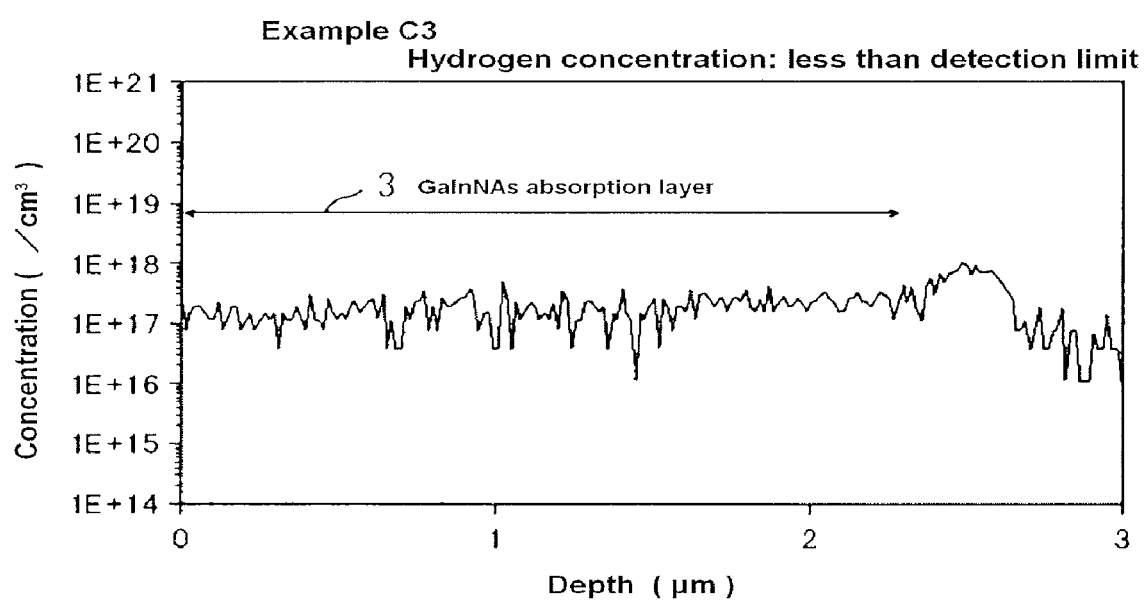
FIG. 9 is a diagram showing the distribution of hydrogen concentration (measured data) of the GaInNAs absorption layer of Example C3 in an embodiment.
Figure 10:
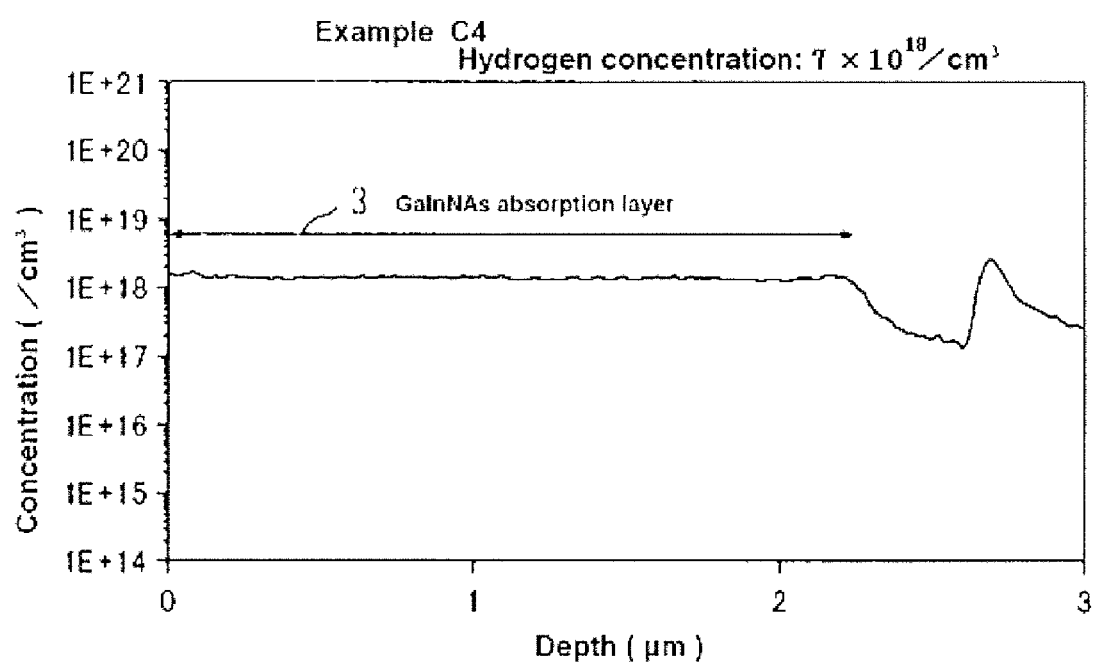
FIG. 10 is a diagram showing the distribution of hydrogen concentration (measured data) of the GaInNAs absorption layer of Example C4 in an embodiment.

The specimens C1 to C4 described above had the following peak wavelengths in photoluminescence: Example C1: 2.0 μm; Example C2: 1.9 μm; Example C3: 1.9 μm; and Example C4: 1.9 μm. Examples C2 to C4 had the same N content in the V-group atoms, which was 2.0 at % (in the expression $Ga_{1-x}In_xN_yAs_{1-y}$, the N content is y=0.02). The GaInNAs absorption layers 3 of the individual specimens had the following hydrogen concentrations. Example C1 had a concentration of $7 \times 10^{18}/cm^3$ as shown in FIG. 7. Example C2, which was produced by annealing Example C1, had a concentration of $5 \times 10^{18}/cm^3$ as shown in FIG. 8. Example C3 had a concentration of less than $1 \times 10^{17}/cm^3$, which was the detection limit, as shown in FIG. 9 (when the measured result is less than the detection limit, the measuring apparatus used shows the data in such a way as shown in FIG. 9). Example C4 had a concentration of $1 \times 10^{18}/cm^3$ as shown in FIG. 10. As can be seen from FIGS. 7 to 10, when the GaInNAs absorption layer 3 is grown through the OMVPE method, the hydrogen concentration at the flat-concentration portion becomes about 100 times that of the GaInNAs absorption layer 3 grown through the MBE method. As can be seen from FIG. 9, when an annealing operation is performed after the GaInNAs absorption layer 3 is grown through the MBE method, the hydrogen concentration at the flat-concentration portion can become less than $1 \times 10^{17}/cm^3$, which is the detection limit. Therefore, when only the hydrogen concentration is the matter to be considered, it is recommendable to form the GaInNAs absorption layer 3 through the MBE method.

Photodiodes each having the structure shown in FIG. 1 were produced using the above-described specimens to measure the dark current. The measured results are shown in Table II. The conditions for the measurement of the dark current were the same as those used in First embodiment.

TABLE II

| | Structure | Production method | GaInNAs absorption layer | | Peak value of hydrogen concentration | Dark current of photodiode with −1 V being applied (active diameter: 100 μm) | Production cost |
| --- | --- | --- | --- | --- | --- | --- | --- |
| | | | Peak wavelength in photoluminescence | N content | | | |
| Example C1 | Invented structure (see FIG. 1) | All layers were grown by OMVPE | 2.0 μm | 1.0% | $7 \times 10^{18}/cm^3$ | $1 \times 10^{-6}$ A | Low |

TABLE II-continued

| | Structure | Production method | GaInNAs absorption layer | | | Dark current of photodiode with −1 V being applied (active diameter: 100 μm) | Production cost |
|---|---|---|---|---|---|---|---|
| | | | Peak wavelength in photoluminescence | N content | Peak value of hydrogen concentration | | |
| Example C2 | Invented structure (see FIG. 1) | Same as Example C1, plus annealing | 1.9 μM | 1.0% | $5 \times 10^{18}/cm^3$ | $1 \times 10^{-7}$ A | Low |
| Example C3 (Example A, plus annealing) | Invented structure (see FIG. 1) | All layers were grown by MBE, plus annealing | 1.9 μm | 1.0% | Less than $1 \times 10^{17}/cm^3$ (detection limit) | $2 \times 10^{-9}$ A | Rather high |
| Example C4 | Invented structure (see FIG. 1) | Method shown in FIG. 2 | 1.9 μm | 1.0% | $1 \times 10^{18}/cm^3$ | $3 \times 10^{-9}$ A | Low |

As can be seen from Table II, Example C1 had a dark current as considerably high as $1\times10^{-6}$ A resulting from the deterioration of the crystal quality caused by the high-concentration hydrogen. This result indicates that it is important to decrease the hydrogen concentration in the absorption layer, rather than the mere providing of the InGaAs buffer layer 4 in the laminated structure.

Table II also shows the evaluation result of the production cost. When viewed from the standpoint of decreasing the dark current, it is best to employ Example C3. However, Example C3 creates a considerable burden caused by the increase in maintenance cost accompanying the growing of the InP window layer 5 through the MBE method. Consequently, the evaluation result for Example C3 becomes "rather high" instead of "low." On the other hand, Example C4 satisfies both the production cost and the decrease in dark current with a good balance. Example C4 is produced in accordance with the process shown in FIG. 2. More specifically, the GaInNAs absorption layer 3 is grown through the MBE method, and the InP window layer 5 is grown through the OMVPE method. Thus, this production method avoids the problem of the adhering of phosphorous compounds to the inner wall of the film-forming chamber. Considering all the factors involved, it is recommendable to employ Example C4 as the best mode of the present invention.

The above-described embodiments are explained by using a photodiode as an example. Nevertheless, the photodetector of the present invention is not limited to a photodiode. Provided that the InGaAs buffer layer is placed between the N-containing InGaAs-based absorption layer and the window layer, the photodetector of the present invention may be used in any applications, including a sensor having a single light-receiving portion, an image pickup apparatus having a two-dimensional array, and various sensors having a one-dimensional array or a two-dimensional array. Furthermore, the present invention includes the case where the elements for decreasing the dark current are used in combination, in addition to the case where a single element is used to decrease the dark current.

Embodiments and examples of the present invention are explained in the above description. The above-disclosed embodiments and examples of the present invention are strictly illustrative, and the scope of the present invention is not limited to these embodiments and examples of the present invention. The scope of the present invention is shown by the description of the scope of the appended claims. Accordingly, the present invention covers all revisions and modifications included within the meaning and scope equivalent to the description of the scope of the claims.

The present invention enables an efficient production of a photodetector that suppresses the dark current and that has a sensitivity in the near-infrared region.

What is claimed is:

1. A photodetector, comprising:
   (a) an InP substrate;
   (b) an absorption layer that is positioned above the InP substrate and that is one absorption layer selected from the group consisting of:
      (b1) a $Ga_{1-x}In_xN_yAs_{1-y-z}Sb_z$ absorption layer, where $0.4 \leq x \leq 0.8$, $0.0001 \leq y \leq 0.12$, and $0 < z \leq 0.1$;
      (b2) a $Ga_{1-x}In_xN_yAs_{1-y-z}P_z$ absorption layer, where $0.4 \leq x \leq 0.8$, $0.0001 \leq y \leq 0.12$, and $0.0001 \leq z \leq 0.01$; and
      (b3) a $Ga_{1-x}In_xN_yAs_{1-y}$ absorption layer, where $0.4 \leq x \leq 0.8$ and $0.0001 \leq y \leq 0.12$;
   (c) a window layer positioned above the absorption layer; and
   (d) an InGaAs buffer layer positioned between the absorption layer and the window layer, wherein the InP substrate, the absorption layer, the InGaAs buffer layer, and the window layer each have a lattice constant that differs from the lattice constant of any of the other members described above by at most 0.2% of the lattice constant of each of the members being compared.

2. The photodetector as defined by claim 1, wherein the window layer is composed of one material selected from the group consisting of InP and InAlAs.

3. The photodetector as defined by claim 1, wherein the absorption layer has a hydrogen concentration of at most $2\times10^{18}/cm^3$.

4. The photodetector as defined by claim 1, wherein:
   (a) the window layer is composed of one material selected from the group consisting of InP and InAlAs; and
   (b) the absorption layer has a hydrogen concentration of at most $2\times10^{18}/cm^3$.

5. The photodetector as defined by claim 1, wherein:
   (a) the absorption layer has a thickness of more than 1 μm; and
   (b) the window layer has a thickness of more than 0.2 μm.

6. The photodetector as defined by claim 1, wherein:
(a) the window layer is composed of one material selected from the group consisting of InP and InAlAs and has a thickness of more than 0.2 μm; and
(b) the absorption layer has a thickness of more than 1 μm.

7. The photodetector as defined by claim 1, wherein:
(a) the absorption layer has a hydrogen concentration of at most $2\times10^{18}/cm^3$ and has a thickness of more than 1 μm; and
(b) the window layer has a thickness of more than 0.2 μm.

8. The photodetector as defined by claim 1, wherein:
(a) the window layer is composed of one material selected from the group consisting of InP and InAlAs and has a thickness of more than 0.2 μm; and
(b) the absorption layer has a hydrogen concentration of at most $2\times10^{18}/cm^3$ and has a thickness of more than 1 μm.

* * * * *